United States Patent
Manipatruni et al.

(10) Patent No.: US 11,552,180 B2
(45) Date of Patent: Jan. 10, 2023

(54) ANTIFERROELECTRIC PEROVSKITE GATE OXIDE FOR TRANSISTOR APPLICATIONS

(71) Applicant: Intel Corporation, Santa Clara, CA (US)

(72) Inventors: Sasikanth Manipatruni, Portland, OR (US); Uygar Avci, Portland, OR (US); Seiyon Kim, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1025 days.

(21) Appl. No.: 16/024,719

(22) Filed: Jun. 29, 2018

(65) Prior Publication Data

US 2020/0006516 A1 Jan. 2, 2020

(51) Int. Cl.
| | | |
|---|---|---|
| *H01L 29/51* | (2006.01) | |
| *H01L 29/78* | (2006.01) | |
| *H01L 29/423* | (2006.01) | |
| *H01L 21/28* | (2006.01) | |
| *H01L 29/66* | (2006.01) | |
| *H01L 21/02* | (2006.01) | |
| *H01L 29/24* | (2006.01) | |
| *H01L 49/02* | (2006.01) | |
| *H01L 29/786* | (2006.01) | |
| *H01L 29/49* | (2006.01) | |
| *H01L 29/06* | (2006.01) | |

(52) U.S. Cl.
CPC ...... *H01L 29/516* (2013.01); *H01L 21/02197* (2013.01); *H01L 21/28088* (2013.01); *H01L 28/55* (2013.01); *H01L 29/24* (2013.01); *H01L 29/40111* (2019.08); *H01L 29/42364* (2013.01); *H01L 29/42372* (2013.01); *H01L 29/4908* (2013.01); *H01L 29/4966* (2013.01); *H01L 29/517* (2013.01); *H01L 29/6684* (2013.01); *H01L 29/66969* (2013.01); *H01L 29/7851* (2013.01); *H01L 29/7869* (2013.01); *H01L 29/78391* (2014.09); *H01L 29/0673* (2013.01)

(58) Field of Classification Search
None
See application file for complete search history.

(56) References Cited

U.S. PATENT DOCUMENTS

| | | |
|---|---|---|
| 9,331,212 B2 | 5/2016 | Kamon |
| 9,722,093 B1 | 8/2017 | Xing et al. |
| 9,893,167 B2 | 2/2018 | Kim et al. |

(Continued)

FOREIGN PATENT DOCUMENTS

WO WO-2009128133 10/2009

OTHER PUBLICATIONS

"Ferroelectrics and Antiferroelectrics",Springer handbook of condensed matter and materials, 2005, XVIII, ISBN: 978-3-540-44376-6, pp. 903-915.

(Continued)

*Primary Examiner* — Vincent Wall
(74) *Attorney, Agent, or Firm* — Schwabe, Williamson & Wyatt P.C.

(57) ABSTRACT

An integrated circuit structure comprises a substrate. An antiferroelectric gate oxide is above the substrate, the antiferroelectric gate oxide comprising a perovskite material. A gate electrode is over at least a portion of the gate oxide.

11 Claims, 8 Drawing Sheets

(56) References Cited

U.S. PATENT DOCUMENTS

2007/0045595 A1* 3/2007 Kondo .............. H01L 27/11502
252/500

OTHER PUBLICATIONS

Kan, Daisuke et al., "Combinatorial search of structural transitions: Systematic investigation of morphotropic phase boundaries in chemically substituted BiFeO3", Materials Research Society, vol. 27, No. 21, Nov. 14, 2012, 14 pgs.

Intel Corporation, "Embedded Non-Volatile Memory Based on Ferroelectric Field Effect Transistors", International Patent Application No. PCT/US2017/038378, filed Jun. 20, 2017, whole document.

Intel Corporation, "Thin Film Transistors Having Relatively Increased Width", International Patent Application No. PCT/US2017/038383, filed Jun. 20, 2017, whole document.

* cited by examiner

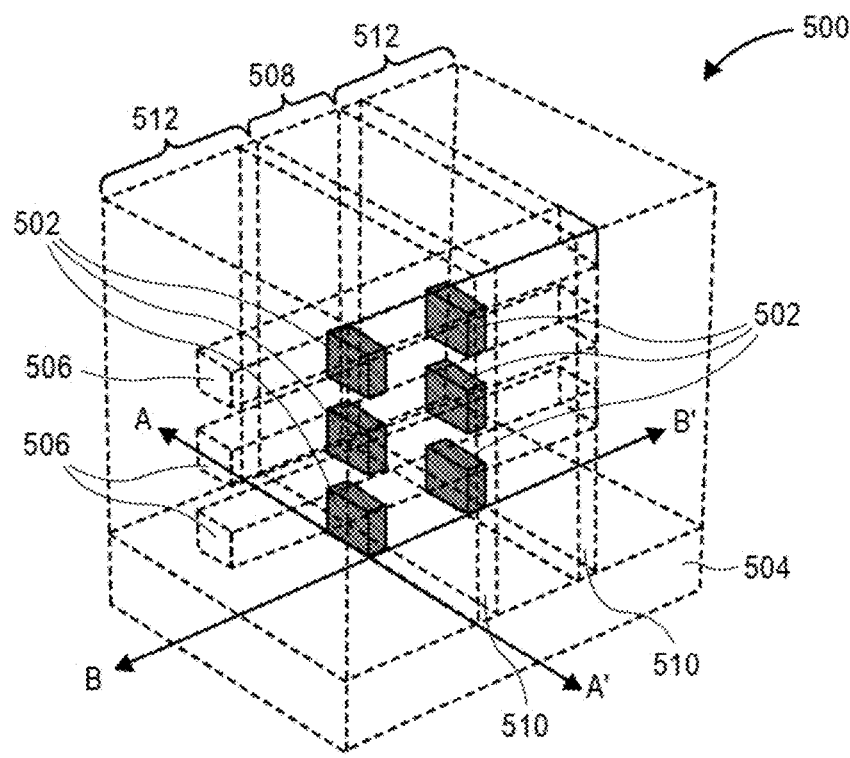
FIG. 5A
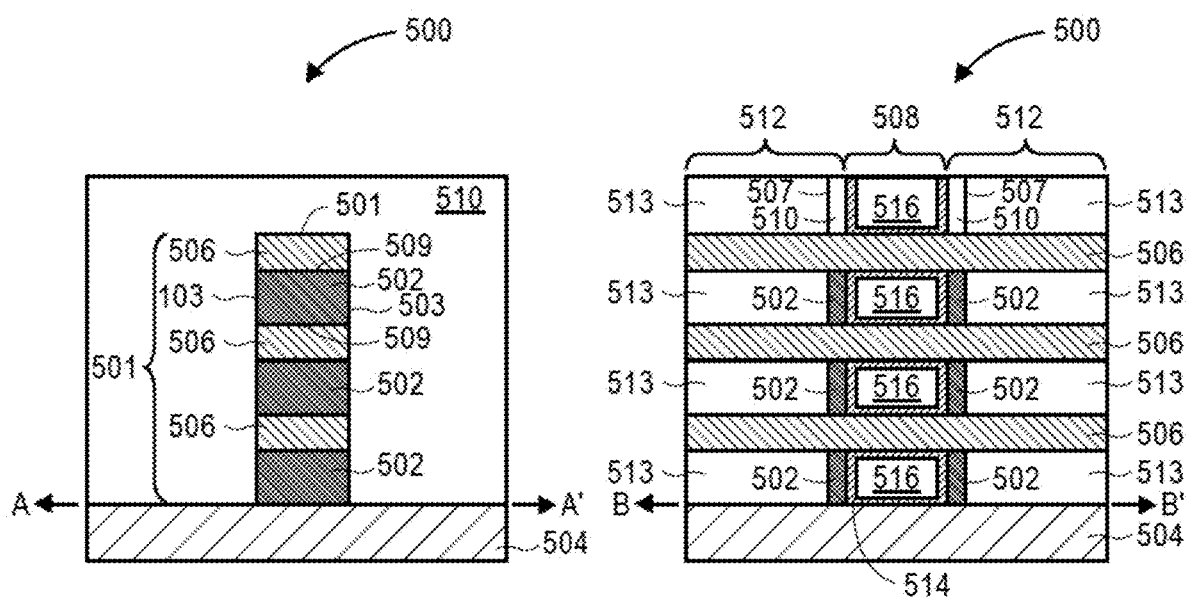
FIG. 5B  FIG. 5C

ANTIFERROELECTRIC PEROVSKITE GATE OXIDE FOR TRANSISTOR APPLICATIONS

TECHNICAL FIELD

Embodiments of the disclosure are in the field of integrated circuit structures and, in particular, an antiferroelectric perovskite gate oxide for transistor applications.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, transistors, whether planar, multi-gate or nanowire, have become more prevalent as device dimensions continue to scale down. The scaling of transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

One component that is critical to the performance of the transistor is the gate dielectric that lies between the gate and the conducting channel. Traditionally, an oxide has been used for the gate dielectric, and there is been a mixed amount of innovation with respect to the gate oxide. One innovation has been the use of ferroelectrics based on hafnium and zirconium derivatives as the gate dielectric to obtain high-K. For various reasons, the use of this hafnium oxide and the like as a gate dielectric has not changed for quite some time. In addition, the amount of hafnium-based ferroelectric materials is very limited.

Variability in conventional and state-of-the-art fabrication processes may limit the possibility to further extend such processes into the, e.g. 10 nm or sub-10 nm range. Consequently, fabrication of the functional components needed for future technology nodes may require the introduction of new methodologies or the integration of new technologies in current fabrication processes or in place of current fabrication processes. Thus, significant improvements are still needed in the area of transistor materials and operation, including expanding the material availability of gate dielectrics to a larger class.

BRIEF DESCRIPTION OF THE DRAWINGS

FIG. 1A illustrates the use of the antiferroelectric perovskite gate oxide in an integrated circuit (IC) structure comprising an example transistor, while FIG. 1B illustrates the use of the antiferroelectric perovskite gate oxide in an IC structure comprising a portion of a capacitance stack or alternatively as a capacitance gate stack.

FIGS. 5A-5C are diagrams illustrating an example nanowire configuration suitable for use with the antiferroelectric perovskite gate oxide disclosed herein.

DESCRIPTION OF THE EMBODIMENTS

Figure 1A:
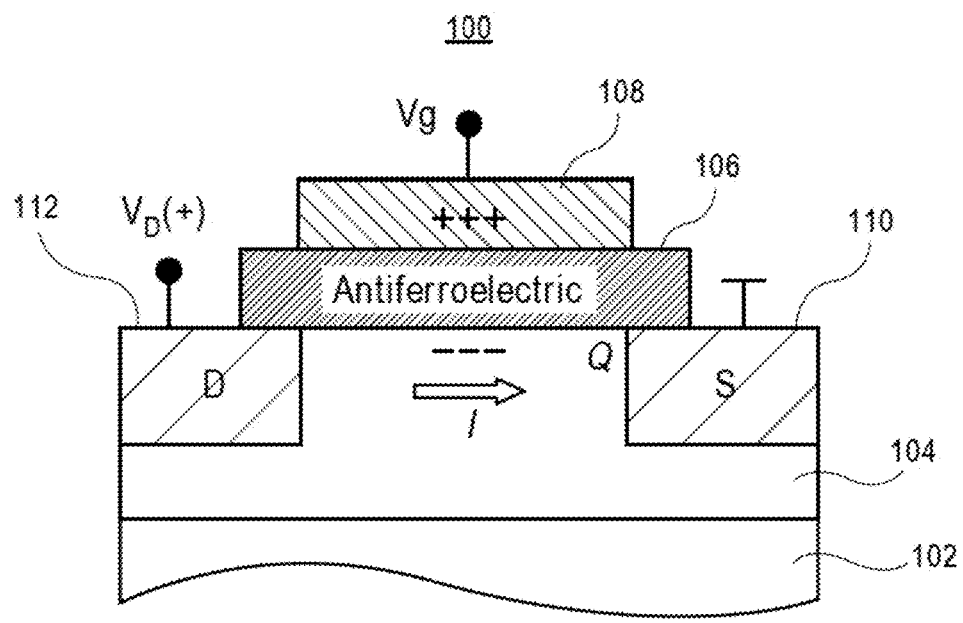
FIGS. 1A and 1B are cross-sectional views illustrating embodiments of an antiferroelectric perovskite gate oxide, where

Antiferroelectric perovskite gate oxide for transistor applications are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to integrated circuit (IC) structures utilizing an expanded class of gate dielectric materials. More specifically, the disclosed embodiments expand the class of gate dielectric materials to antiferroelectric perovskite gate oxides. Embodiments may utilize the antiferroelectric perovskite gate oxide in one or more of different types of transistors, capacitors and gate stacks. A transistor or capacitor fabricated using such an architecture may exhibit the ability to access robust antiferroelectricity (AFE), the ability to tune the AFE effect, and an increase in gate leakage control. Applications of such systems may include, but are not limited to, logic, memory, or analog applications.

Figure 1B:
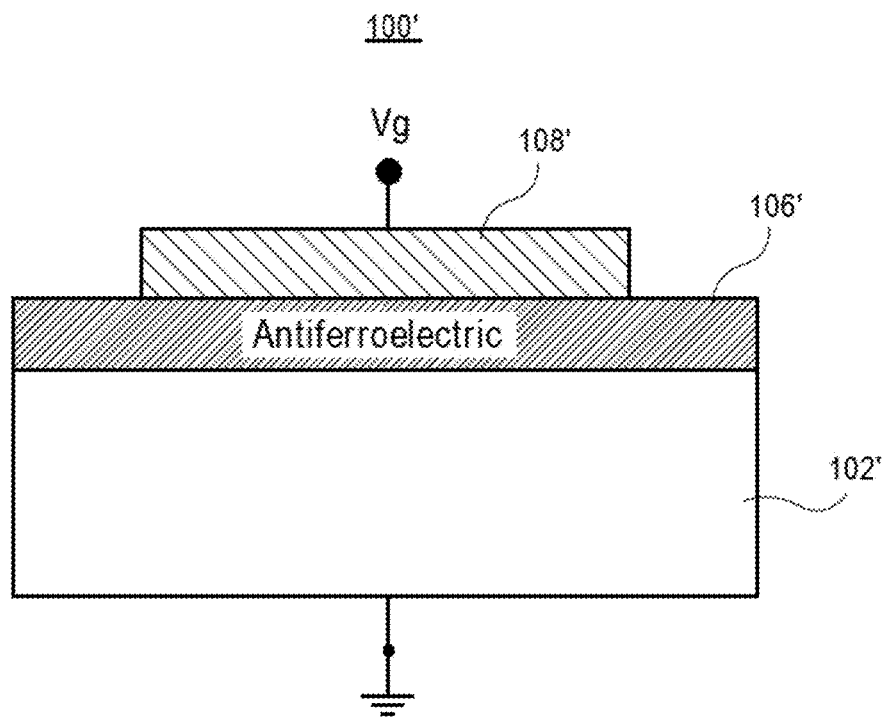

FIGS. 1A and 1B are cross-sectional views illustrating embodiments of an antiferroelectric perovskite gate oxide, where FIG. 1A illustrates the use of the antiferroelectric perovskite gate oxide in an integrated circuit (IC) structure comprising an example transistor, while FIG. 1B illustrates the use of the antiferroelectric perovskite gate oxide in an IC structure comprising a portion of a capacitance stack, or alternatively, as a capacitance gate stack.

Referring to FIGS. 1A and 1B, an integrated circuit structure 100/100' includes a substrate 102/102' and an antiferroelectric gate oxide 106/106' above the substrate 102/102'. According to disclosed embodiments, the antiferroelectric gate oxide 106/106' comprises a perovskite material. A gate electrode 108/108' is over and in contact with at least a portion of the gate oxide 106.

An IC device, such as a transistor or capacitor, utilizing the antiferroelectric gate oxide 106/106' comprising perovskite material enables improved electro-statics for transistor applications, a boost in drive currents at high voltage bias, and enables turbo mode by improving high voltage, current operation.

An antiferroelectric crystal is defined as a crystal whose structure can be considered as being composed of two sub-lattices polarized spontaneously in antiparallel directions and in which a ferroelectric phase can be induced by application of an electric field. The general chemical formula for perovskite compounds is $ABX_3$, where A and B are two cations of very different sizes, and X is an anion that bonds to both. In one embodiment, the antiferroelectric perovskite material comprises $ABO_3$ type perovskites, where A and B represent two different cations and O represents oxygen elements.

Figure 2:
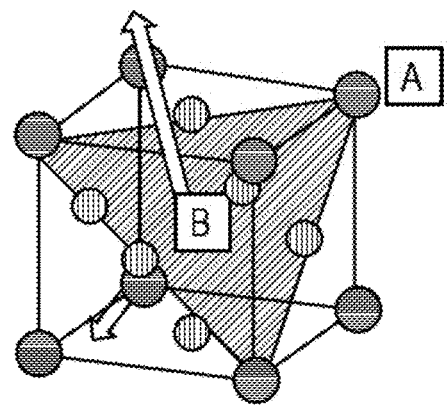
FIG. 2 is a diagram illustrating a cubic perovskite unit cell $ABO_3$ type perovskites.

FIG. 2 is a diagram illustrating a cubic perovskite unit cell $ABO_3$ type perovskites. In perovskite oxides ($ABO_3$), the A-site cations are larger than B-site cations. The unit cell of an ideal perovskite structure is a cube, where the large spheres represent A-site cations in one sub-lattice at the corners of the cube, and the smaller spheres represent B-site cation in another sub-lattice located in the body center. Oxygen (not shown) is located in the face centers. The arrows represent orientation of spin magnetic moments of the A-site and the B-site atoms.

One advantage of the perovskite structures is the large flexibility in tailoring the chemical composition and lattice parameter(s) of the system by substituting the different cations that present on both the A and B sites without changing the overall structure completely.

According to one aspect of the present embodiments, the perovskite material comprising the antiferroelectric gate oxide 106/106' is stoichiometry controlled to obtain tunable gate leakage. In one embodiment, the A-site may be doped with a rare earth material for first site ferroelectricity, and the B-site may be doped with a 3d block transition metal for second site ferroelectricity. In one embodiment, the perovskite material comprising the antiferroelectric gate oxide 106/106' comprises chemically substituted alkaline-earth iron perovskites ($AFeO_3$) (which may exclude hafnia and zirconia material in some embodiments). For example, in one specific embodiment, the perovskite material comprising the antiferroelectric gate oxide 106/106' comprises chemically substituted $BiFeO_3$ (BFO). BFO has the advantage of being Pb-free, has a multiferroic nature due to the coexistence of ferroelectricity and antiferromagnetism, and maintains ferroelectric properties at room temperature.

The present embodiments utilizes the advantages of BFO as an antiferroelectric gate oxide 106/106' and uses stoichiometry of the A-site and/or B-site substitutions to lower leakage current. In some embodiments, the rare-earth element samarium (Sm) is partially substituted into the A-site of the BFO lattice, resulting in a structural phase transition from the rhombohedral to the orthorhombic phase. At the structural boundary, this may enhance both the piezoelectric coefficient and the dielectric constant. In other embodiments, the 3d block transition metal strontium (Sr) is substituted into the B-site of the BFO lattice.

In one embodiment, the A-site of comprises $Bi_{1-x}Sm_x$ to produce a non-leaky antiferroelectric gate oxide 106/106' to control carrier concentrations in order to tailor the magnetic properties for specific gate electrode applications. In one embodiment, x ranges from approximately 0.25 to 0.95. In one embodiment, the the B-site comprises $Fe_{1-y}Sc_y$ to produce a non-leaky antiferroelectric perovskite gate oxide to control carrier concentrations. In one embodiment, y ranges from approximately 0.25 to 0.95. In yet another embodiment, the A- and B-site of BFO are cosubstituted to obtain $(Bi_{1-x}Sm_x)(Fe_{1-y}Sc_y)O_3$.

Figure 3:
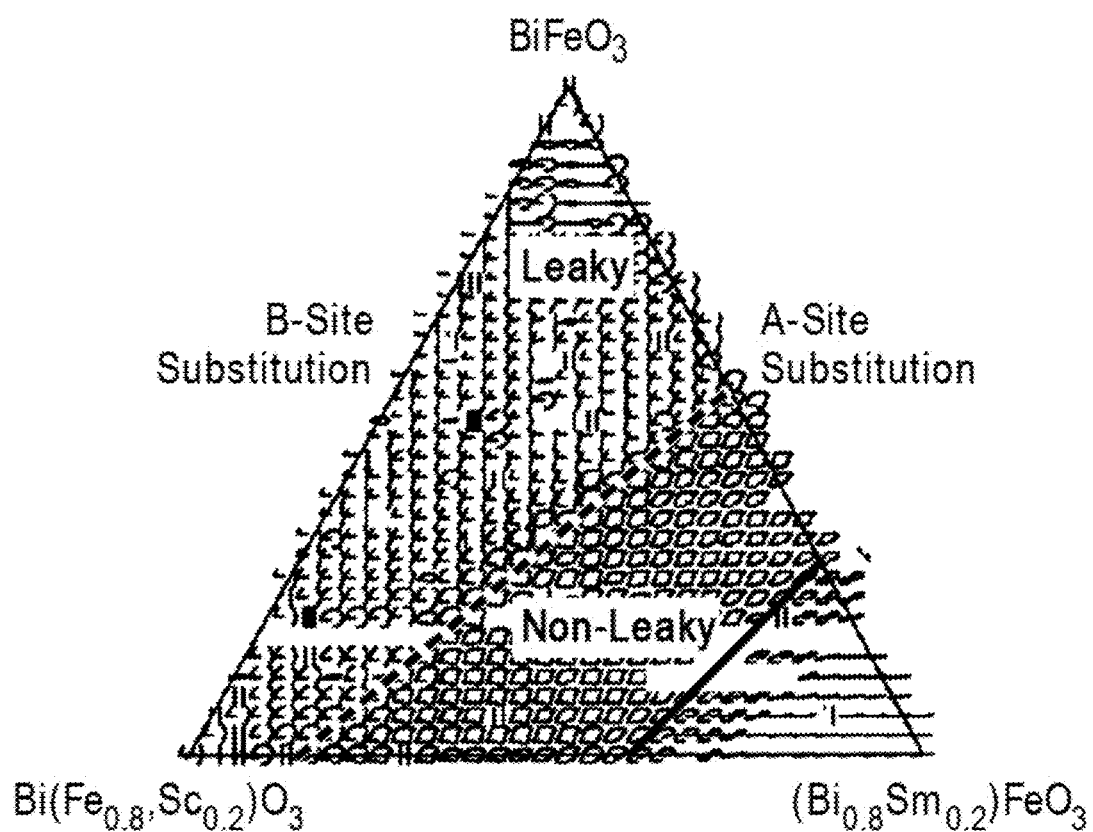
FIG. 3 is a diagram illustrating polarization-electric field (P-E) hysteresis loops across a pseudoternary composition spread library of ferroelectric properties in A- and B-site cosubstituted BFO.

FIG. 3 is a diagram illustrating polarization-electric field (P-E) hysteresis loops across a pseudoternary composition spread library of ferroelectric properties in A- and B-site cosubstituted BFO. The top of the triangle represents hysteresis loops in low substitution regions, i.e., primarily $BiFeO_3$. Sm and Sc are the substitutional dopants for the A- and B-site, respectively. The substituting composition of the A-site dopant varies along the right side of the triangle down to the composition $(Bi_{0.8}Sm_{0.2})FeO_3$. The substituting composition of the B-site dopant varies along the left side of the triangle down to the composition $Bi(Fe_{0.8},Sc_{0.2})O_3$. As the Sm and Sc substitutions are increased, more square-shaped P-E hysteresis loops become present. This indicates that the substitution results in a reduction of the leakage current. The region where only Sc is substituted in the B-site corresponds to hysteresis loops that are characteristic of leaky ferroelectrics. The region where only Sm is substituted in the A-site corresponds to hysteresis loops that are characteristic of non-leaky ferroelectrics. Consequently, Sm substitution is more effective in reducing the leakage current than Sc substitution. However, according to the present embodiments, the leakage current is now customizable for a specific IC applications by varying concentrations of the Sm and Sc substitutions.

Referring again to FIGS. 1A and 1B, the gate electrode 108/108' comprises a material that is compatible with the antiferroelectric gate oxide 106. In one embodiment, the gate electrode 108 comprises a material selected from a group comprising: $SrPbO_3$, $LaSrMnO_3$, and $LaSrCoO_3$.

Referring again to FIG. 1A, the IC structure 100 comprises a transistor, and further includes a semiconductor channel layer 104 above the substrate 102. The gate electrode 108, which is on the antiferroelectric gate oxide 106, has a first side and a second side opposite the first side. A first source/drain region 110 is at the first side of the gate electrode 108, and a second source/drain region 112 is at the second side of the gate electrode 108. In one embodiment, the antiferroelectric gate oxide 106 comprising perovskite material is directly on the semiconductor channel layer 104. In another embodiment, the IC structure 100 may further include an insulator material layer (not shown) between and in contact with the gate oxide 106 and the semiconductor channel layer 104. In one such embodiment, the insulator material layer may be composed of a dielectric material such as, but not limited to, silicon dioxide, silicon oxy-nitride.

In an embodiment, the semiconductor channel layer 104 is an amorphous or a polycrystalline material. In an embodiment, the semiconductor channel layer 104 includes silicon or indium gallium zinc oxide (IGZO). In a latter such embodiment, the IGZO layer has a gallium to indium ratio of 1:1, a gallium to indium ratio greater than 1 (e.g., 2:1, 3:1, 4:1, 5:1, 6:1, 7:1, 8:1, 9:1, or 10:1), or a gallium to indium ratio less than 1 (e.g., 1:2, 1:3, 1:4, 1:5, 1:6, 1:7, 1:8, 1:9, or 1:10). A low indium content IGZO may refer to IGZO having more gallium than indium (e.g., with a gallium to indium ratio greater than 1:1), and may also be referred to as high gallium content IGZO. Similarly, low gallium content IGZO may refer to IGZO having more indium than gallium (e.g., with a gallium to indium ratio less than 1:1), and may also be referred to as high indium content IGZO.

Referring again to FIG. 1B, in the embodiment where the IC structure 100' comprises a capacitor, the antiferroelectric gate oxide 106' is suitable for use in a capacitance stack integrated in the back end of line (BEOL) of CMOS (complementary metal-oxide-semiconductor). In a further embodiment, the antiferroelectric gate oxide 106' may be used in a gate capacitance stack or in a capacitance stack of a trench capacitor.

It is to be appreciated that the layers and materials described in association with embodiments herein are typically formed on or above an underlying semiconductor substrate; e.g., as FEOL layer(s). In other embodiments, the layers and materials described in association with embodiments herein are formed on or above underlying device layer(s) of an integrated circuit, e.g., as BEOL layer(s). In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back end of line (BEOL) interconnect layers. For example, in one embodiment, an IC structure 100/100' having the antiferroelectric perovskite gate oxide is formed on a material composed of a dielectric material such as, but not limited to, silicon dioxide, silicon oxy-nitride, silicon nitride, or carbon-doped silicon nitride. In a particular embodiment, an IC structure 100/100' having the antiferroelectric perovskite gate oxide is formed on a low-k dielectric layer of an underlying BEOL layer.

In one embodiment, the transistor is not limited to the planar configuration shown in FIG. 1A. In some embodiments, the transistor may have a configuration, including, but not limited to, fin-FET, silicon on insulator (SOI), nanowire (horizontal or vertical), as illustrated further below.

FIGS. 4A-4E are diagrams illustrating example transistor configurations suitable for use with the antiferroelectric perovskite gate oxide describe above.

Figure 4A:
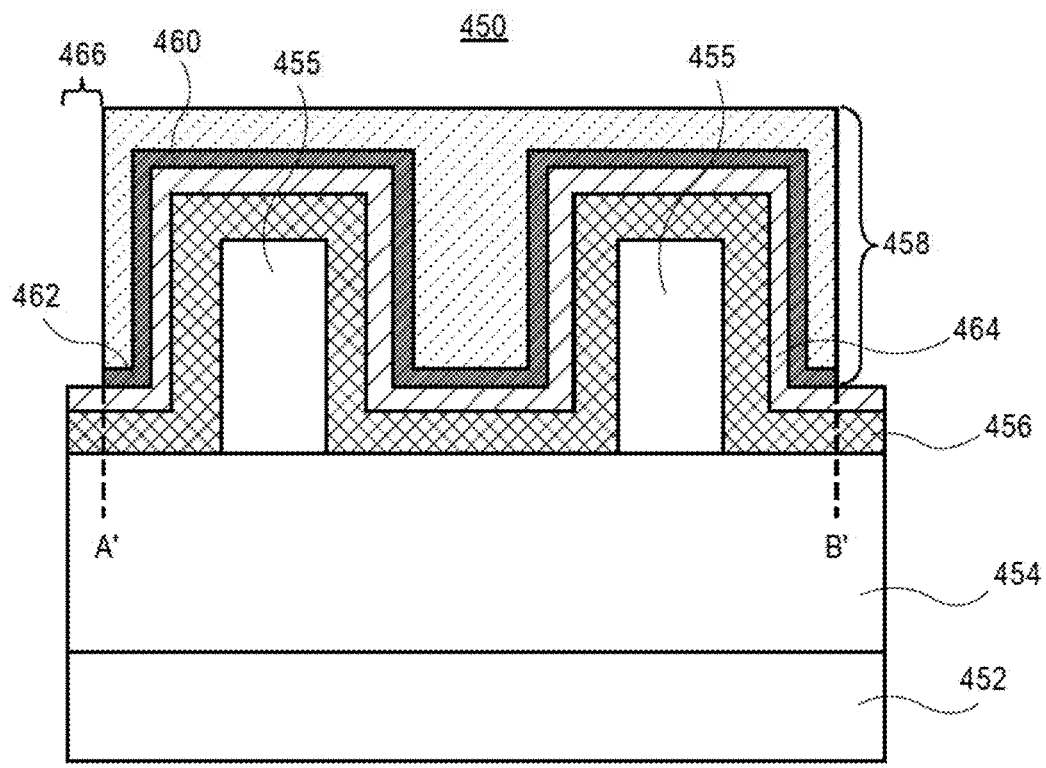
FIGS. 4A-4E are diagrams illustrating example transistor configurations suitable for use with an antiferroelectric perovskite gate oxide.

FIG. 4A illustrates a cross-sectional view taken along a gate "width" of a fin-type transistor suitable for use in a monolithic stacked transistor architecture, in accordance with an embodiment of the present disclosure. In this example, the fin-type transistor comprises a non-planar thin-film transistor (TFT) 450 formed above a substrate 452, e.g., on an insulating layer 454 above the substrate. A pair of dielectric fins 455 is on the insulating layer 454. The non-planar TFT 450 includes a semiconducting oxide material 456, or similarly suitable channel material. The semiconducting oxide material 456 is conformal with the pair of dielectric fins 455 and with exposed portions of the insulating layer 454 between the pair of dielectric fins 455. An antiferroelectric gate oxide 464 is formed on the semiconducting oxide material 456, and a gate electrode 458 is formed on the antiferroelectric gate oxide 464. In this embodiment, the antiferroelectric gate oxide comprising the perovskite material may be approximately 1-10 nm in thickness, and a width of the gate electrode 458 matches the configuration of the non-planar TFT 450.

The gate electrode 458 may include a fill material 460 on a workfunction layer 462, as is depicted. The gate electrode 458 may expose regions 466 of the semiconducting oxide material 456 and the antiferroelectric gate oxide 464, as is depicted. Alternatively, the semiconducting oxide material 456 and the antiferroelectric gate oxide 464 have a same lateral dimension as the gate electrode 458. It is to be appreciated that source/drain regions are into and out of the page of the view of FIG. 4A.

The non-planar TFT 450 has an effective gate width that is the length of the conformal semiconducting oxide material 456 between locations A' and B', i.e., the full length including undulating portions over the tops and sidewalls of the dielectric fins 455. The TFT 450 may be referred to herein as a non-planar BEOL field effect transistor (FET). In comparison to a conventional planar TFT, the structure of FIG. 4A highlights the advantage of a non-planar architecture to increase effective gate width, referred to herein as a relatively increased width.

Figure 4B:
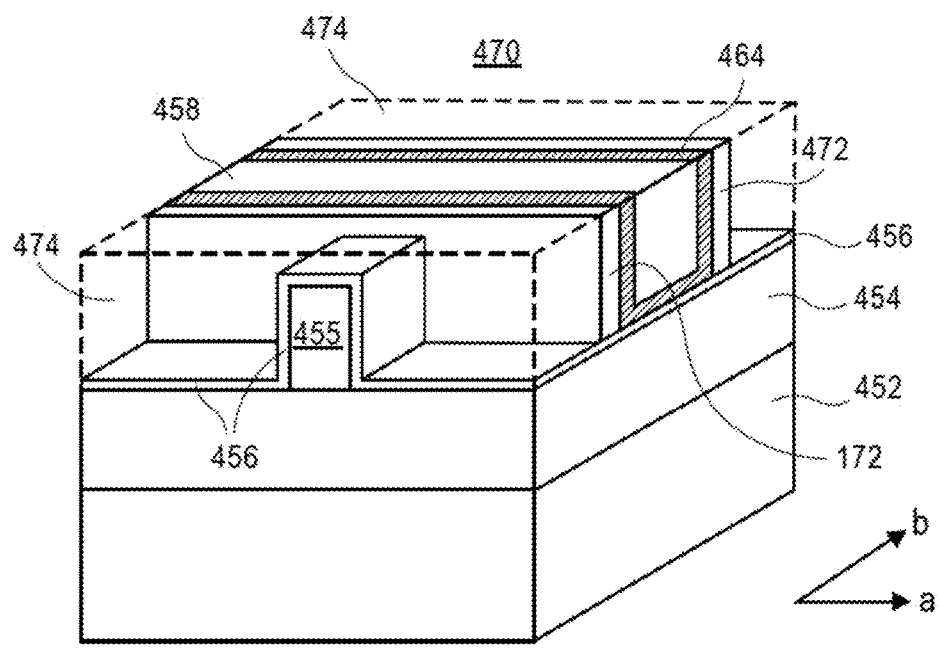
Figure 4C:
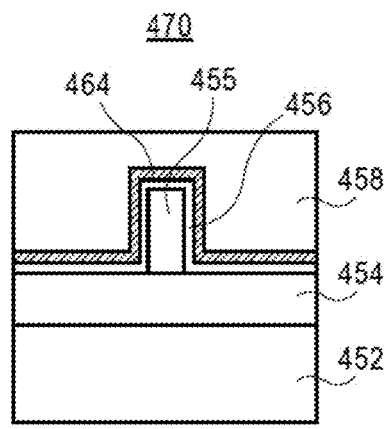

To highlight other aspects of a fin-type transistor topography, FIGS. 4B and 4C illustrate angled and direct cross-sectional views of a thin film integrated circuit structure, in accordance with an embodiment of the present disclosure. It is to be appreciated that one dielectric fin is illustrated in FIGS. 4B and 4C for simplification. Embodiments may include a single device fabricated over one (FIGS. 4B and 4C), two (FIG. 4A) or more such dielectric fins.

Referring to FIGS. 4B and 4C, an integrated circuit structure 470 includes a dielectric fin 455 on an insulator layer 454 above a substrate 452. The insulator structure 455 has a topography that varies along a plane (ab) parallel with a global plane of the substrate 452. The dielectric fin 455 has a top and sidewalls. A semiconducting oxide material 456, or similarly suitable channel material, is on the top and sidewalls of the dielectric fin 455. A gate electrode 458 is over a first portion of the semiconducting oxide material 456 on the top and sidewalls of the dielectric fin 455. The insulator structure 455 has a topography that varies along a plane (ab) parallel with a global plane of the substrate 452. The gate electrode 458 has a first side opposite a second side. A first conductive contact (left 474) is adjacent the first side of the gate electrode 458, over a second portion of the semiconducting oxide material 456 on the top and sidewalls of the dielectric fin 455. A second conductive contact (right 474) is adjacent the second side of the gate electrode 458, over a third portion of the semiconducting oxide material 456 on the top and sidewalls of the dielectric fin 455.

In an embodiment, the integrated circuit structure 470 further includes an antiferroelectric gate oxide 464 between the gate electrode 458 and the first portion of the semiconducting oxide material 456 on the top and sidewalls of the dielectric fin 455, as is depicted in FIG. 4C. In an embodiment, the integrated circuit structure 470 further includes a first dielectric spacer (left 472) between the first conductive contact 474 and the first side of the gate electrode 458, the first dielectric spacer 472 over a fourth portion of the semiconducting oxide material 456 on the top and sidewalls of the dielectric fin 455 as is depicted in FIG. 4B. A second dielectric spacer (right 472) is between the second conductive contact 474 and the second side of the gate electrode 458, the second dielectric spacer 472 over a fifth portion of the second semiconducting oxide material 456 on the top and sidewalls of the dielectric fin 455, as is depicted in FIG. 4C. In one such embodiment, the antiferroelectric gate oxide 464 is further along the first and second dielectric spacers 472, as is also depicted in FIG. 4C.

In an embodiment, the insulator structure 455 (such as fin or fins 455) is composed of a dielectric material such as, but not limited to, silicon dioxide, silicon oxy-nitride, silicon nitride, or carbon-doped silicon nitride. In an embodiment, the insulator structure 455 is composed of a low-k dielectric material.

Figure 4D:
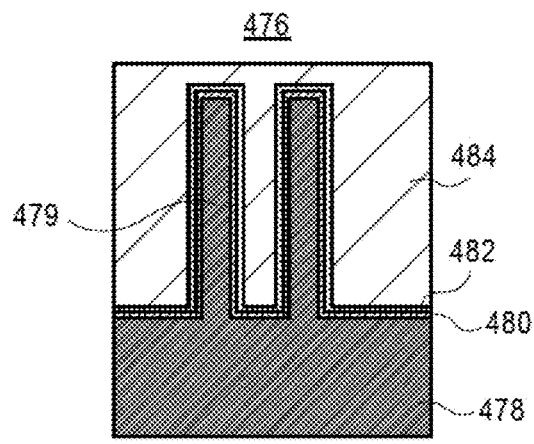

FIG. 4D illustrates a cross-sectional view taken along a gate "width" of a bulk Fin-type field effect transistors (FinFET), in accordance with another embodiment of the present disclosure. In this example, the bulk FinFET 476 is formed above a bulk semiconductor 478 such as silicon, silicon germanium, gallium arsenide, and the like. A pair of fins 479 is on the bulk semiconductor 478. The fins 479 of the bulk FinFET 476 may be composed of the same material as the bulk semiconductor 478. The bulk FinFET 476 includes an antiferroelectric gate oxide 480 is conformal to the pair of fins 479. A gate electrode 482 or other materials are formed on the antiferroelectric gate oxide 480, such as work function metal(s), diffusion barrier(s) and the like. A conductor metal 484, such as tungsten, titanium nitride, copper, and the like, is formed over the other materials 482, as shown.

Figure 4E:
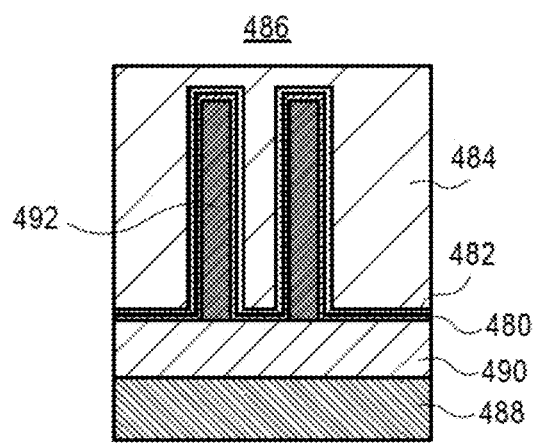

FIG. 4E illustrates a cross-sectional view taken along a gate "width" of a silicon-on-insulator (SOI) FinFET suitable for use in a monolithic stacked transistor architecture, in accordance with further embodiment of the present disclosure. In this example, the SOI FinFET 486 is formed above a bulk substrate 488. A SOI oxide or bonding layer 490 is formed over the bulk substrate 488. A pair of fins 492 is o the bulk substrate 488. The fins 492 of the SOI FinFET 486 may be composed of the same material as the bulk substrate 488. The SOI FinFET 486 includes an antiferroelectric gate oxide 480 is conformal to the pair of fins 492. The antiferroelectric gate oxide 480 may possibly include a transition layer. A gate electrode 482 or other materials are formed on the antiferroelectric gate oxide 480, such as work function metal(s), diffusion barrier(s) and the like. A conductor metal 484 is formed over the other materials 482, as shown.

According to the disclosed embodiments, the antiferroelectric gate oxides 464, 480 of FIGS. 4A-4E are composed of a perovskite material and stoichiometry controlled to obtain a tunable gate leakage. For example, in one embodiment, the gate dielectric layer 514 is composed of a material such as, but not limited to, $(Bi_{1-x}Sm_x)(Fe_{1-y}Sc_y)O_3$. In an embodiment, gate electrodes 458, 482 are composed of a metal layer such as, but not limited to, $SrPbO_3$, $LaSrMnO_3$, and $LaSrCoO_3$.

FIGS. 5A-5C are diagrams illustrating an example nanowire configuration suitable for use with the antiferroelectric perovskite gate oxide disclosed herein. Components of nanowire transistor 500 that are illustrated in FIGS. 5B and 5C are either omitted or represented by dashed lines in FIG. 5A in order to clearly illustrate the placement of internal spacers 502. Referring now to FIG. 5A, an isometric view of a portion of a nanowire transistor 500 having internal gate sidewall spacers 502 is illustrated, according to an embodiment of the invention. Internal spacers 502 are positioned within the source/drain region 512 of device 500, adjacent to the channel region 508, between adjacent nanowires 506, and further defined by external sidewall spacer 510. In an embodiment, another pair of internal spacers 502 are positioned within the source/drain region 512 of device 500, adjacent to the channel region 508, between the bottommost nanowire 506 and substrate 504, and further defined by external sidewall spacer 510.

Illustrated in the cross-sectional view shown by an embodiment in FIG. 5B, nanowire transistor 500 features a plurality of nanowires 506, disposed above a substrate 504 in a vertical nanowire stack 501. The cross-section of FIG. 5B is taken along the line A-A' of the nanowire device 500 in FIG. 5A. The nanowire stack 501 has an internal region and an external region. In an embodiment, the internal region contains the nanowires 506 and the materials and/or volume between the nanowires 506. In an embodiment, the internal region also contains the materials and/or volume between the bottommost nanowire and the substrate 504. In an embodiment, the external region contains all materials and/or volume not contained within the internal region.

Substrate 504 may be composed of a material suitable for semiconductor device fabrication. In one embodiment, the structure is formed using a bulk semiconductor substrate. Substrate 504 may include, but is not limited to, silicon, germanium, silicon-germanium, or a III-V compound semiconductor material. In another embodiment, the substrate 504 is a silicon-on-insulator (SOI) substrate. An SOI substrate includes a lower bulk substrate, a middle insulator layer disposed on the lower bulk substrate, and a top monocrystalline layer. The middle insulator layer may comprise silicon dioxide, silicon nitride, or silicon oxynitride. The top single crystalline layer may be any suitable semiconductor material, such as those listed above for a bulk substrate.

In an embodiment, nanowires 506 are formed from a semiconductor material. In one such embodiment, nanowires 506 are single-crystalline and have a lattice constant.

Nanowires 506 may be a material such as, but not limited to, silicon, germanium, SiGe, GaAs, InSb, GaP, GaSb, InAlAs, InGaAs, GaSbP, GaAsSb, and InP. In a specific embodiment, nanowires 506 are silicon. In another specific embodiment, nanowires 506 are germanium. In an embodiment, the nanowires 506 comprise a stressed material, particularly the channel portion of nanowires 506 within channel region 508 of device 500. In an embodiment, nanowires 506 have source/drain portions in source/drain regions 512 of device 500.

As illustrated in FIG. 5C, channel region 508 of the device 500 is defined by a gate structure, which wraps around the perimeter of each nanowire 506. The cross-section of FIG. 5C is taken along the line B-B' of the nanowire device 500 in FIG. 5A.

In FIG. 5C, the gate structure comprises an antiferroelectric gate oxide 514 in contact with the full perimeter of the channel portions of the nanowires 506, and a gate electrode 516 wrapping around the antiferroelectric gate oxide 514, according to an embodiment of the present invention. In an embodiment, antiferroelectric gate oxide 514 is composed of a perovskite material and is stoichiometry controlled to obtain a tunable gate leakage. For example, in one embodiment, the gate dielectric layer 514 is composed of a material such as, but not limited to, $(Bi_{1-x}Sm_x)(Fe_{1-y}Sc_y)O_3$. In an embodiment, gate electrode 516 is composed of a metal layer such as, but not limited to, $SrPbO_3$, $LaSrMnO_3$, and $LaSrCoO_3$.

A pair of source/drain regions 512 are disposed on opposite sides of the channel region 508, according to an embodiment. In an embodiment, a pair of external gate sidewall spacers 510 are formed on the portion of the gate structure sidewalls external to the nanowire stack, one within each of the source/drain regions 512. The thickness and material of the external sidewall spacer 510 may be selected to offset doping of the source/drain portions of nanowires 506, to minimize overlap capacitance between the portions of channel region 508 and source/drain region 512 external to the nanowire stack, to reduce device leakage, and to reduce the risk of shorting between the gate electrode and the source/drain contacts. Sidewall spacers 510 may be composed of an insulative dielectric material such as, but not limited to, silicon dioxide, silicon oxy-nitride, or silicon nitride. External sidewall spacers 510 may be 20 to 500 Å thick.

Internal sidewall spacers 502 are adjacent to the gate structure, within the source/drain region 512 and between adjacent nanowires 506, according to an embodiment of the invention. With brief reference to FIG. 5B, in an embodiment, internal sidewall spacers 502 are defined by two opposing surfaces 509 of adjacent nanowires 506, and two opposing surfaces 503 of external sidewall spacers 510. Referring back to FIG. 5C, internal sidewall spacers 502 are further defined by channel region 508, as defined by the surface of the gate structure, according to an embodiment. In an embodiment, internal sidewall spacers 502 are aligned with surface 507 of external sidewall spacer 510. In an embodiment, internal sidewall spacers 502 are a cross-linked photo-definable dielectric material. Additionally, the internal sidewall spacers may be of the same or different thickness as the external sidewall spacers 510, such as from 20 to 500 Å.

In an embodiment, the internal sidewall spacers 502 protect against shorting and leakage, and reduce overlap capacitance between the gate structure and conductive or semiconductive material 513 in the internal region of the nanowire stack within the source/drain regions 512 of device 500. For example, where material 513 is a metal source/drain contact, wrapping around the source/drain portions of nanowires 506, internal spacers reduce capacitance between the portions of the gate electrode 516 and the metal source/drain contacts 513 that are internal to the nanowire stack. Material 513 may also be a semiconductive material. The internal sidewall spacers 502 may be formed of a cross-linked photo-definable dielectric material.

In an embodiment depicted in FIG. 5D, source/drain regions 512 comprise homogeneous source and drain portions 515. In a specific embodiment, homogeneous source/drain portions 515 are in electrical contact with the channel portions of each nanowire 506. In an embodiment, homogeneous source and drain portions 515 may be doped or undoped semiconductor material. In another specific embodiment, homogeneous source/drain portions 515 are a metal species. In an embodiment, a portion of nanowires 506 remains in the source/drain region 512, such as between internal spacers 502, as shown in FIG. 5D. In another embodiment, all of the source/drain portions of nanowires 506 have been removed, such that nanowires 506 are only within the channel region 508.

The embodiments disclosed herein may be fabricated using any suitable and known fabrication techniques. In one embodiment, a process for fabricating an IC structure comprising antiferroelectric gate oxide may include forming a substrate, forming an antiferroelectric gate oxide above the substrate, the antiferroelectric gate oxide comprising a perovskite material. A gate electrode is formed over at least a portion of the gate oxide.

The integrated circuit structures described herein may be included in an electronic device. As an example of one such apparatus, FIGS. 6A and 6B are top views of a wafer and dies that include one or more IC structures with an antiferroelectric perovskite gate oxide, in accordance with one or more of the embodiments disclosed herein.

Figure 6B:
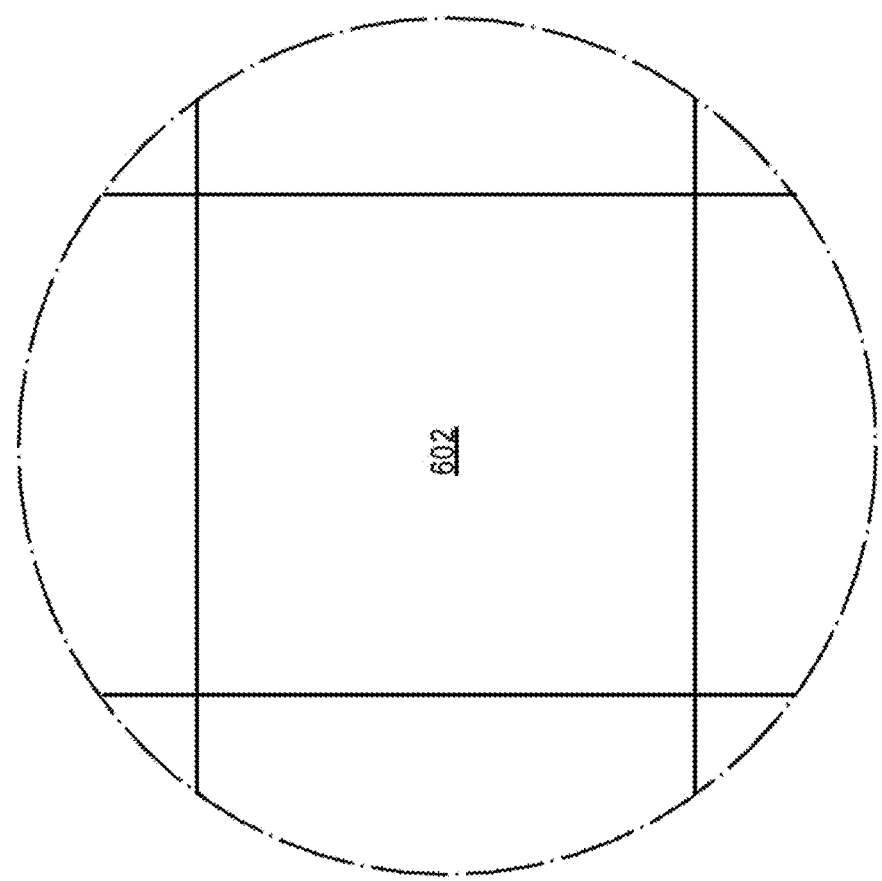
FIGS. 6A and 6B are top views of a wafer and dies that include one or more IC structures with an antiferroelectric perovskite gate oxide, in accordance with one or more of the embodiments disclosed herein.
Figure 6A:
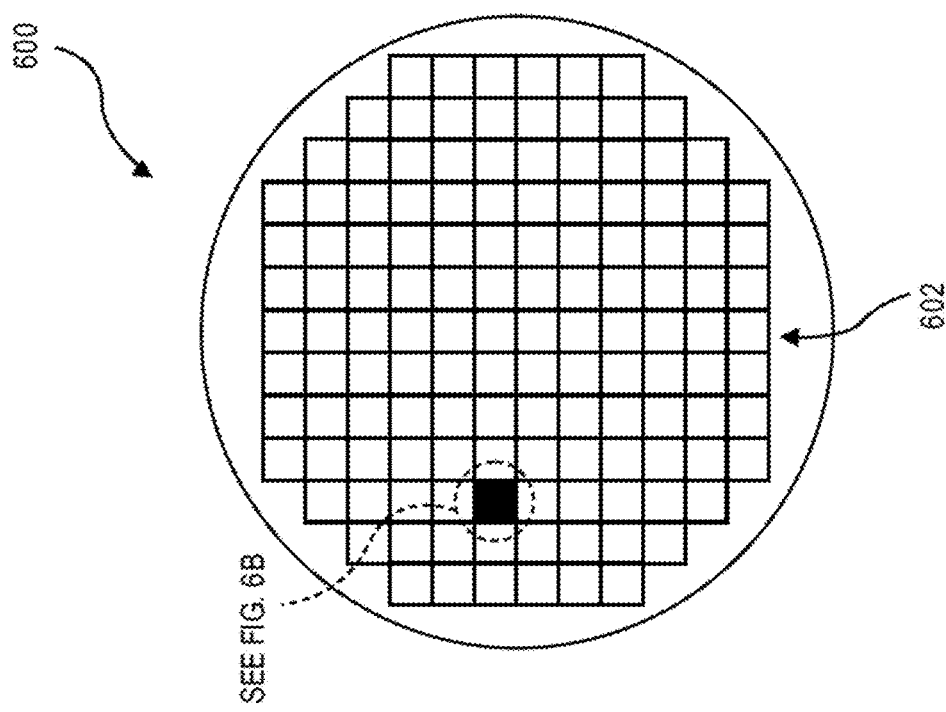

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more IC structures with an antiferroelectric perovskite gate oxide, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an antiferroelectric perovskite gate oxide as disclosed herein may take the form of the wafer 600 (e.g., not singulated) or the form of the die 602 (e.g., singulated). The die 602 may include one or more IC structures antiferroelectric perovskite gate oxide and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
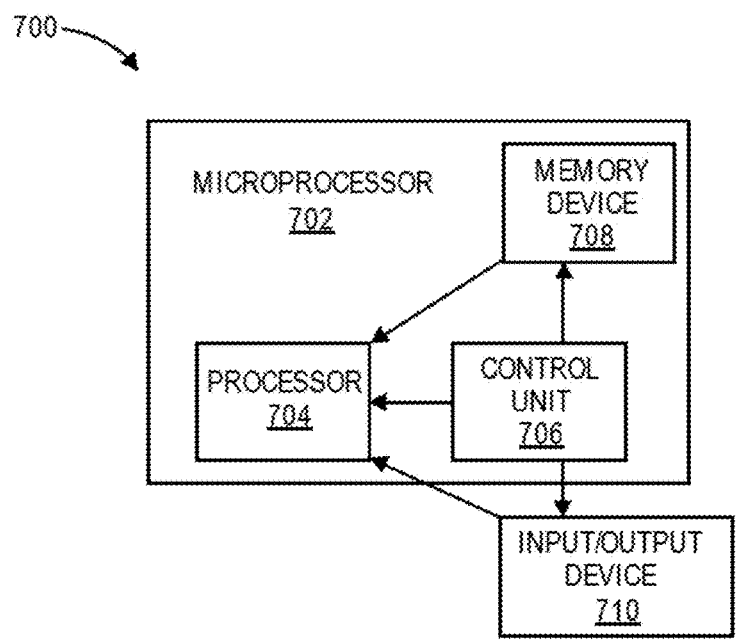
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more IC structures with an antiferroelectric perovskite gate oxide, such as those described herein.

Figure 8:
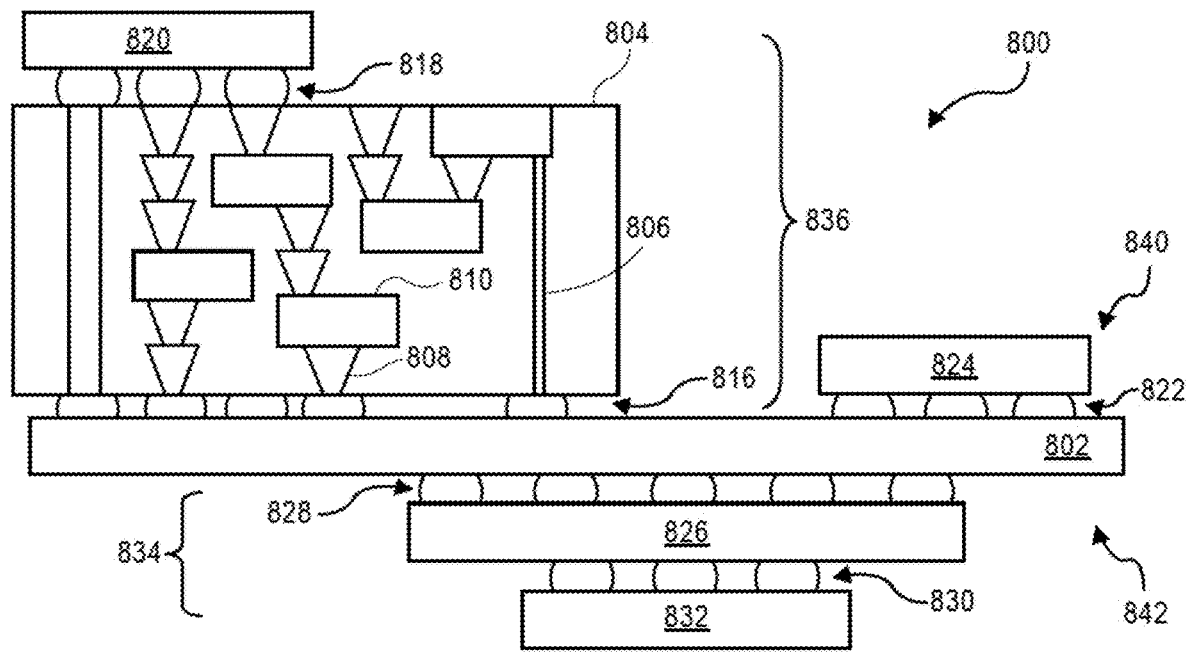
FIG. 8 is a cross-sectional side view of an integrated circuit (IC) device assembly that may include one or more IC structures with an antiferroelectric perovskite gate oxide, in accordance with one or more of the embodiments disclosed herein.

FIG. 8 is a cross-sectional side view of an integrated circuit (IC) device assembly that may include one or more IC structures with an antiferroelectric perovskite gate oxide, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of IC structures with an antiferroelectric perovskite gate oxide, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 702 of FIG. 7B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
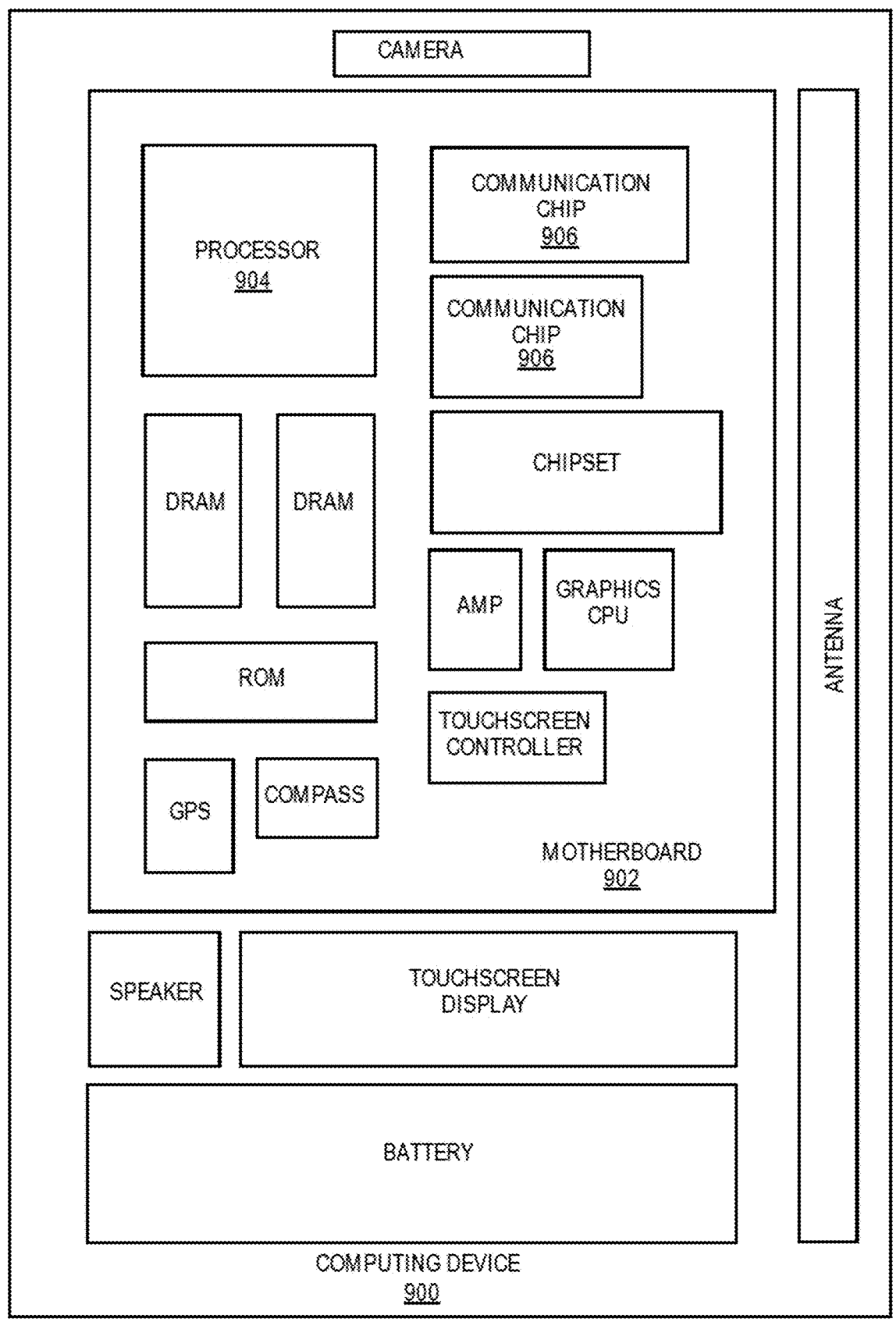
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more IC structures with an antiferroelectric perovskite gate oxide, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more IC structures with an antiferroelectric perovskite gate oxide, in accordance with implementations of embodiments of the disclosure.

In further implementations, another component housed within the computing device 900 may contain an integrated circuit die that includes one or more IC structures with an antiferroelectric perovskite gate oxide, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include IC structures having an antiferroelectric perovskite gate oxide.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure comprises a substrate. An antiferroelectric gate oxide is above the substrate, the antiferroelectric gate oxide comprising a perovskite material. A gate electrode is over at least a portion of the gate oxide.

Example Embodiment 2

The integrated circuit structure of embodiment 1, wherein the integrated structure is selected from a group comprising: a transistor, a capacitance stack; and a gate capacitance stack.

Example Embodiment 3

The integrated circuit structure of embodiment 2, wherein the transistor includes a configuration selected from a group comprising: planar, fin-FET, nanowire, and silicon on insulator (SOI).

Example Embodiment 4

The integrated circuit structure of embodiment 1, 2 or 3, wherein the gate electrode comprises a material selected from a group comprising: $SrPbO_3$, $LaSrMnO_3$, and $LaSrCoO_3$.

Example Embodiment 5

The integrated circuit structure of embodiment 1, 2, 3 or 4, wherein the integrated structure comprises a fin-FET transistor, and wherein the antiferroelectric gate oxide comprising the perovskite material is approximately 1-10 nm in thickness, and a width of the gate electrode matches the configuration of the transistor.

Example Embodiment 6

The integrated circuit structure of embodiment 1, 2, 3, 4 or 5, wherein the antiferroelectric perovskite material is stoichiometry controlled to obtain a tunable gate leakage.

Example Embodiment 7

The integrated circuit structure of embodiment 6, wherein the antiferroelectric perovskite material comprises $ABO_3$ type perovskites having sub-lattices that include an A-site and a B-site, wherein the A-site is doped with a rare earth material for first site ferroelectricity.

Example Embodiment 8

The integrated circuit structure of embodiment 7, wherein the B-site is doped with a 3d block transition metal for second site ferroelectricity.

Example Embodiment 9

The integrated circuit structure of embodiment 7 or 8, wherein the antiferroelectric perovskite material is a chemically substituted alkaline-earth iron perovskite $AFeO_3$.

Example Embodiment 10

The integrated circuit structure of embodiment 7, 8 or 9, wherein the antiferroelectric perovskite material comprises chemically substituted $BiFeO_3$.

Example Embodiment 11

The integrated circuit structure of embodiment 10, wherein the A-site comprises $Bi_{1-x}Sm_x$ to produce a non-leaky antiferroelectric perovskite gate oxide to control carrier concentrations.

Example Embodiment 12

The integrated circuit structure of embodiment 11, wherein x ranges from approximately 0.25 to 0.95.

Example Embodiment 13

The integrated circuit structure of embodiment 10, wherein the B-site comprises $Fe_{1-y}Sc_y$.

Example Embodiment 14

The integrated circuit structure of embodiment 13, wherein y ranges from approximately 0.25 to 0.95.

Example Embodiment 15

An integrated circuit structure comprises a substrate. An antiferroelectric gate oxide is above the substrate, the antiferroelectric gate oxide comprising a perovskite material. A gate electrode is over at least a portion of the gate oxide. A source region is on one side of the gate electrode and a drain region is on an opposite side of the gate electrode.

Example Embodiment 16

The integrated circuit structure of embodiment 15, wherein the gate electrode comprises a material selected from a group comprising: $SrPbO_3$, $LaSrMnO_3$, and $LaSrCoO_3$.

Example Embodiment 17

The integrated circuit structure of embodiment 15 or 16 4, wherein the integrated structure comprises a fin-FET transistor, and wherein the antiferroelectric gate oxide comprising the perovskite material is approximately 1-10 nm in thickness, and a width of the gate electrode matches the configuration of the transistor.

Example Embodiment 18

The integrated circuit structure of embodiment 15, 16 or 17, wherein the antiferroelectric perovskite material is stoichiometry controlled to obtain a tunable gate leakage.

Example Embodiment 19

The integrated circuit structure of embodiment 6, wherein the antiferroelectric perovskite material comprises $ABO_3$ type perovskites having sub-lattices that include an A-site and a B-site, wherein the A-site is doped with a rare earth material for first site ferroelectricity.

Example Embodiment 20

The integrated circuit structure of embodiment 7, wherein the B-site is doped with a 3d block transition metal for second site ferroelectricity.

Example Embodiment 21

The integrated circuit structure of embodiment 19 or 20, wherein the antiferroelectric perovskite material is a chemically substituted alkaline-earth iron perovskite $AFeO_3$.

Example Embodiment 22

The integrated circuit structure of embodiment 19, 20 or 21, wherein the antiferroelectric perovskite material comprises chemically substituted $BiFeO_3$.

Example Embodiment 23

The integrated circuit structure of embodiment 22, wherein the A-site comprises $Bi_{1-x}Sm_x$ and the B-site comprises $Fe_{1-y}Sc_y$ to produce a non-leaky antiferroelectric perovskite gate oxide to control carrier concentrations, wherein x and y independently range from approximately 0.25 to 0.95.

Example Embodiment 24

A method of fabricating an integrated circuit structure comprises forming a substrate. An antiferroelectric gate oxide is formed above the substrate, the antiferroelectric gate oxide comprising a perovskite material. A gate electrode is formed over at least a portion of the gate oxide.

Example Embodiment 25

The method of embodiment 24, further comprising: forming the gate oxide with a stoichiometry controlled $(Bi_{1-x}Sm_x)(Fe_{1-y}Sc_y)O_3$, and forming the gate electrode with a material selected from a group comprising: $SrPbO_3$, $LaSrMnO_3$, and $LaSrCoO_3$.

What is claimed is:

1. An integrated circuit structure, comprising:
a substrate;
an antiferroelectric gate oxide directly on the substrate, the antiferroelectric gate oxide consisting of a perovskite material, wherein the antiferroelectric perovskite material comprises chemically substituted $BiFeO_3$, wherein an A-site comprises $Bi_{1-x}Sm_x$ to produce a non-leaky antiferroelectric perovskite gate oxide to control carrier concentrations, and wherein a B-site comprises $Fe_{1-y}Sc_y$, wherein x and y independently range from approximately 0.25 to 0.95; and
a gate electrode over at least a portion of the gate oxide.

2. The integrated circuit structure of claim 1, wherein the integrated structure is selected from a group comprising: a transistor, a capacitance stack; and a gate capacitance stack.

3. The integrated circuit structure of claim 1, wherein the gate electrode comprises a material selected from a group comprising: $SrPbO_3$, $LaSrMnO_3$, and $LaSrCoO_3$.

4. The integrated circuit structure of claim 1, wherein the antiferroelectric perovskite material comprises $ABO_3$ type perovskites having sub-lattices that include an A-site and a B-site, wherein the A-site is doped with a rare earth material for first site ferroelectricity.

5. The integrated circuit structure of claim 4, wherein the B-site is doped with a 3d block transition metal for second site ferroelectricity.

6. The integrated circuit structure of claim 4, wherein the antiferroelectric perovskite material is a chemically substituted alkaline-earth iron perovskite $AFeO_3$.

7. An integrated circuit structure, comprising:
a substrate;
a gate oxide directly on the substrate, the gate oxide consisting of an antiferroelectric perovskite material, wherein the antiferroelectric perovskite material comprises $BiFeO_3$, wherein an A-site comprises $Bi_{1-x}Sm_x$ to produce a non-leaky antiferroelectric perovskite gate oxide to control carrier concentrations, and wherein a B-site comprises $Fe_{1-y}Sc_y$, wherein x and y independently range from approximately 0.25 to 0.95;
a gate electrode over at least a portion of the gate oxide; and
a source region on one side of the gate electrode and a drain region on an opposite side of the gate electrode.

8. The integrated circuit structure of claim 7, wherein the gate electrode comprises a material selected from a group comprising: $SrPbO_3$, $LaSrMnO_3$, and $LaSrCoO_3$.

9. The integrated circuit structure of claim 7, wherein the antiferroelectric perovskite material comprises $ABO_3$ type perovskites having sub-lattices that include an A-site and a B-site, wherein the A-site is doped with a rare earth material for first site ferroelectricity.

10. The integrated circuit structure of claim 9, wherein the B-site is doped with a 3d block transition metal for second site ferroelectricity.

11. The integrated circuit structure of claim 9, wherein the antiferroelectric perovskite material is a chemically substituted alkaline-earth iron perovskite $AFeO_3$.

* * * * *